United States Patent
Nakayama et al.

(10) Patent No.: US 8,149,006 B2
(45) Date of Patent: Apr. 3, 2012

(54) PROBE CARD

(75) Inventors: Hiroshi Nakayama, Nagano (JP);
Mitsuhiro Nagaya, Nagano (JP); Yoshio Yamada, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 455 days.

(21) Appl. No.: 12/086,008

(22) PCT Filed: Dec. 4, 2006

(86) PCT No.: PCT/JP2006/324184
§ 371 (c)(1),
(2), (4) Date: Nov. 4, 2009

(87) PCT Pub. No.: WO2007/066623
PCT Pub. Date: Jun. 14, 2007

(65) Prior Publication Data
US 2010/0052707 A1 Mar. 4, 2010

(30) Foreign Application Priority Data
Dec. 5, 2005 (JP) .................................. 2005-351305

(51) Int. Cl.
*G01R 31/20* (2006.01)
(52) U.S. Cl. ............ 324/754.01; 324/754.03; 324/574.1
(58) Field of Classification Search .................. None
See application file for complete search history.

(56) References Cited

U.S. PATENT DOCUMENTS

| | | | |
|---|---|---|---|
| 6,043,666 A | 3/2000 | Kazama et al. | |
| 7,750,655 B2 | 7/2010 | Mochizuki et al. | |
| 2004/0104738 A1 | 6/2004 | Mori | |
| 2005/0237070 A1 | 10/2005 | Kazama | |
| 2009/0219043 A1* | 9/2009 | Nakayama et al. | 324/754 |

FOREIGN PATENT DOCUMENTS

| | | |
|---|---|---|
| CN | 1646922 A | 7/2005 |
| JP | 63-293845 | 11/1988 |
| JP | 10-019926 | 1/1998 |
| JP | 2004-077153 | 3/2004 |
| JP | 2004-117215 | 4/2004 |
| JP | 2005-164600 | 6/2005 |
| JP | 2005-164601 | 6/2005 |
| JP | 2007-003334 | 1/2007 |

(Continued)

OTHER PUBLICATIONS

Notice of Allowance dated Dec. 21, 2010, issued for the corresponding Korean Patent Application No. 2008-7016265.
International Search Report dated Feb. 6, 2007, issued in PCT/JP2006/324184.
Office Action in corresponding Chinese Patent Application issued on Jun. 4, 2010.

(Continued)

*Primary Examiner* — Melissa Koval
*Assistant Examiner* — Trung Nguyen
(74) *Attorney, Agent, or Firm* — Edwards Wildman Palmer LLP

(57) ABSTRACT

A probe card includes probes that come into contact with a semiconductor wafer to receive or output an electric signal; a probe head that holds the probes; a substrate that has a wiring pattern corresponding to a circuit structure for generating a signal for a test; a reinforcing member that reinforces the substrate; an interposer that is stacked on the substrate and includes a housing having connection terminals resilient in an axial direction thereof and hole portions each housing one of the connection terminals; and a space transformer that is stacked between the interposer and the probe head and transforms intervals among the wires.

6 Claims, 10 Drawing Sheets

FOREIGN PATENT DOCUMENTS

| | | |
|---|---|---|
| KR | 10-2007-0026632 | 3/2007 |
| WO | WO-96/15458 | 5/1996 |
| WO | WO-03/087854 | 10/2003 |
| WO | WO-2005/103740 A2 | 11/2005 |
| WO | WO-2005/114228 | 12/2005 |
| WO | WO-2006/126279 | 11/2006 |
| WO | WO-2007/015314 | 2/2007 |

OTHER PUBLICATIONS

Decision to Grant Patent for Japanese Patent Application No. 2005-351305 issued Aug. 29, 2011.

* cited by examiner

PROBE CARD

CROSS REFERENCE TO RELATED APPLICATIONS

This application is related to co-pending application entitled: "PROBE CARD" filed even date herewith in the name of Hiroshi NAKAYAMA, Mitsuhiro NAGAYA, and Yoshio YAMADA as a national phase entry of PCT/JP2006/324183, which application is assigned to the assignee of the present application and is incorporated by reference herein.

TECHNICAL FIELD

The present invention relates to a probe card that electrically connects a semiconductor wafer as a test object and a circuit structure for generating a signal for a test.

BACKGROUND ART

In a semiconductor test process, a conductivity test is sometimes performed to detect a defective product by bringing probes having conductivity (conductive probes) into contact with a semiconductor wafer before dicing (WLT: Wafer Level Test). When this WLT is performed, to transfer a signal for a test generated and sent by a testing device (tester) to the semiconductor wafer, a probe card including a large number of probes is used. In the WLT, the probes are individually brought into contact with each of dies on the semiconductor wafer while the dies are scanned by the probe card. However, because several hundreds to several ten thousands dies are formed on the semiconductor wafer, it takes considerable time to test one semiconductor wafer. Thus, an increase in the number of dies causes higher cost.

To solve the problems of the WLT, recently, a method called FWLT (Full Waver Level Test) is also used in which several hundreds to several ten thousands probes are collectively brought into contact with all or at least a quarter to a half of dies on a semiconductor wafer. To accurately bring the probes into contact with the semiconductor wafer, this method requires technologies for maintaining positional accuracy of tips of probes by accurately keeping the parallelism or the flatness of a probe card with respect to a predetermined reference surface and for highly accurately aligning a semiconductor wafer.

FIG. 10 is a diagram of an example of the structure of a probe card applied in the FWLT. A probe card 71 shown in FIG. 10 includes a plurality of probes 72 provided according to an arrangement pattern of electrode pads on a semiconductor wafer, a probe head 73 that houses the probes 72, a space transformer 74 that transforms an interval of a fine wiring pattern in the probe head 73, an interposer 75 for connection of wires led out from the space transformer 74, a substrate 77 that connects wires 76 through the interposer 75 to a testing device, a male connector 78 provided on the substrate 77 and connected to a female connector provided on the testing device side, and a reinforcing member 79 for reinforcing the substrate 77.

Among these components, as the interposer 75, the one having a thin-film base material made of an insulative material such as ceramic and a plurality of leaf-spring connection terminals disposed in a predetermined pattern on both sides of the base material and formed in a cantilever shape is known. In the case of this interposer, connection terminals provided on one surface of the interposer 75 come into contact with electrode pads of the space transformer 74 and connection terminals provided on the other surface come into contact with electrode pads of the substrate 77, whereby electrical connection is established between the space transformer 74 and the substrate 77 (see, for example, Patent Document 1).

A technology is also known for forming the interposer 75 with pressure sensitive rubber (rubber connector), in which metal particles are arranged in a thickness direction in thin-walled silicone rubber. When a pressure is applied in the thickness direction, the metal particles adjacent to one another in the silicone rubber come into contact with one another, whereby the pressure sensitive rubber exhibits anisotropic conductivity. The space transformer 74 and the substrate 77 are electrically connected by applying the pressure sensitive rubber having such a characteristic as the interposer 75.

Patent Document 1: Japanese Patent No. 3386077

DISCLOSURE OF INVENTION

Problem to be Solved by the Invention

However, when leaf-spring connection terminals are applied to the conventional interposer as described above, if there is a defect in one connection terminal, as only the connection terminal cannot be replaced, the entire interposer needs to be replaced. This results in heavier maintenance such as repair and higher cost.

When pressure sensitive rubber is applied to the interposer, stable contact resistance is not achieved unless sufficient pressure is applied to the pressure sensitive rubber. In particular, when deformation such as warp, waviness, and irregularity occurs in the substrate or the space transformer, such deformation cannot be appropriately corrected. Consequently, some portions of the substrate or the space transformer cannot be electrically connected.

The present invention has been achieved to solve the above problems in the conventional technology and it is an object of the present invention to provide a probe card capable of reliably establishing an electrical connection between a substrate and a space transformer and facilitating the maintenance while reducing the cost thereof.

Means For Solving Problem

According to an aspect of the present invention, a probe card electrically connects a semiconductor wafer as a test object and a circuit structure for generating a signal for a test. The probe card includes a plurality of probes that are made of a conductive material and come into contact with the semiconductor wafer to receive or output an electric signal; a probe head that houses and holds the probes; a substrate that has a wiring pattern corresponding to the circuit structure; a reinforcing member that is mounted on the substrate and reinforces the substrate; an interposer that includes a housing and is stacked on the substrate for connection of wires of the substrate, the housing having a plurality of connection terminals made of a conductive material and resilient in the axial direction thereof and a plurality of hole portions made of an insulative material each housing one of the connection terminals; and a space transformer that is interposed and stacked between the interposer and the probe head and transforms intervals among the wires to be connected through the interposer. The wires comes out on a surface of the space transformer facing the probe head.

In the probe card, the connection terminals may each include a first needle-like member and a second needle-like member each having a tapered tip; and a spring member that is in a coil shape and resiliently connects the first needle-like member to the second needle-like member such that axial directions of the first needle-like member and the second needle-like member match.

In the probe card, the spring member may include a tightly wound portion that is bendable in each of the hole portions and, when bent, comes into contact with any one of the first needle-like member and the second needle-like member.

In the probe card, the connection terminals may be in a coil shape, and each may include a pair of electrode pin portions in each of which a coil is closely wound to be tapered toward either end in the axial direction; and a coil spring portion that connects between the electrode pin portions.

In the probe card, the coil spring portion may include a tightly wound portion that is arranged in a middle, in the axial direction, of each of the connection terminals; a constantly wound portion that is arranged on a side of the tightly wound portion; and a loosely wound portion that is arranged on a side of the tightly wound portion other than where the constantly wound portion is arranged, in which a coil is wound more loosely than in the constantly wound portion.

The probe card may further include a holding member that is fixed to the substrate and presses and holds the interposer and the space transformer; and a leaf spring that is fixed to the holding member and presses an edge portion of a surface of the probe head over the entire circumference in the direction of the substrate. The probes project from the surface of the probe head.

Effect of the Invention

With the probe card according to an aspect of the present invention, it is possible to reliably establish an electrical connection between the substrate and the space transformer and facilitate the maintenance as well as to reduce the cost thereof.

Figure 1:
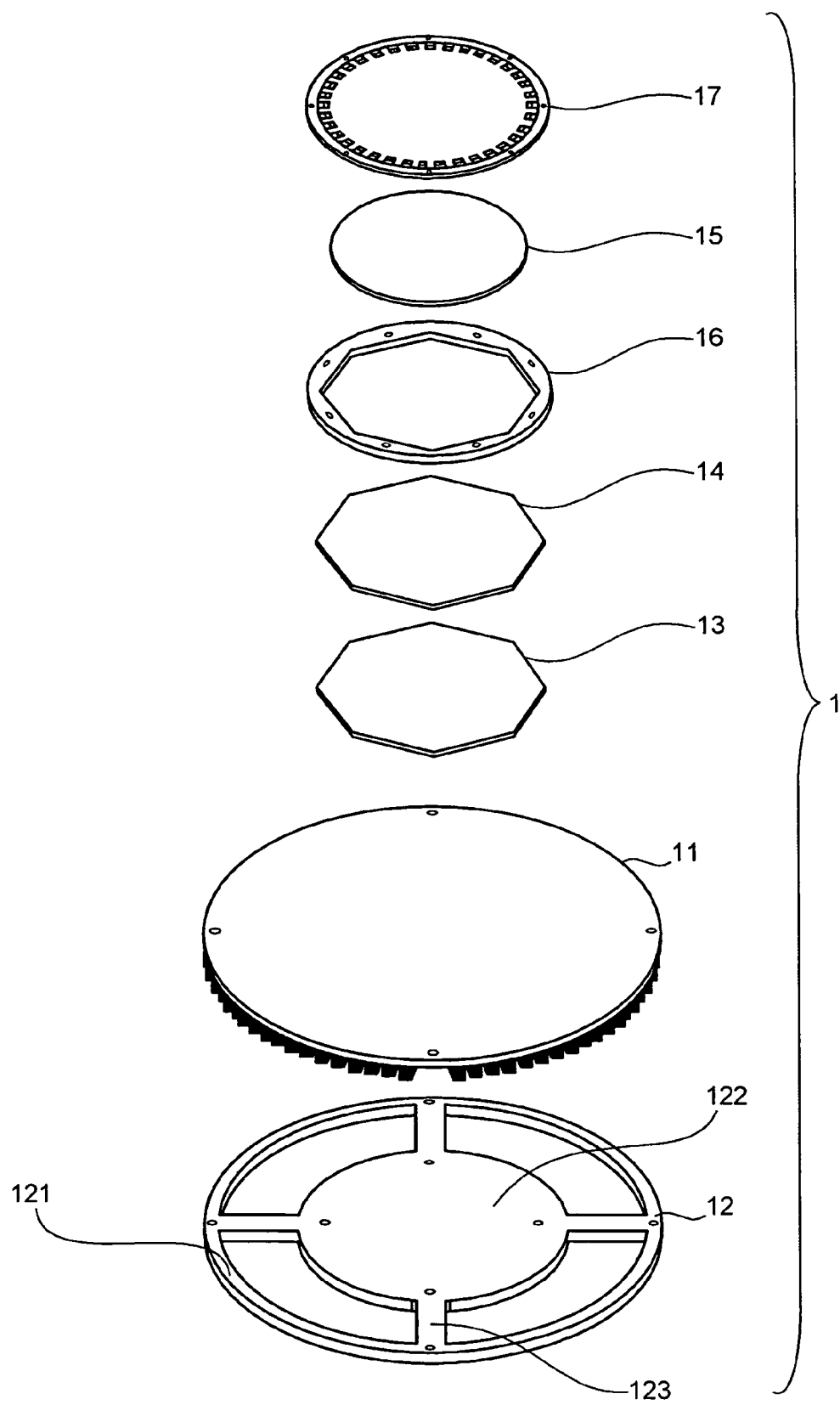
FIG. 1 is a exploded perspective view of the structure of relevant part of a probe card according to a first embodiment of the present invention.

EXPLANATIONS OF LETTERS OR NUMERALS 1, 61, 71 probe cards
2, 72 probe
3 connector seat
4 semiconductor wafer
11, 62, 77 substrate
12, 79 reinforcing member
13, 51, 75 interposer
14, 74 space transformer
15, 63, 73 probe head
15$p$, 63$p$ probe housing area
16 holding member
17, 64 leaf spring
18, 76 wire
19, 78 male connector
21, 22, 133, 134 needle-like member
21$a$, 22$a$, 133$a$, 134$a$ needle-like portion
21$b$, 22$c$, 133$c$, 134$c$ boss portion
21$c$ shaft portion
22$b$, 133$b$, 134$b$ flange portion
23, 135 spring member
23$a$, 53$f$, 135$a$ loosely wound portion
23$b$, 53$e$, 135$b$ tightly wound portion
30 female connector
40 wafer chuck
41, 111, 141 electrode pad
52, 131 housing
53, 132 connection terminal
53$a$ coil spring portion
53$b$, 53$c$ electrode pin portion
53$d$ constantly wound portion
54, 136, 137, 151 hole portion
54$a$, 136$a$, 137$a$, 151$a$ small diameter hole
54$b$, 136$b$, 137$b$, 151$b$ large diameter hole
121 outer peripheral portion
122 central portion
123 coupling portion
131$a$ first member
131$b$ second member
171, 641 pawl portion

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions and the like are different from realistic ones. It goes without saying that, the drawings depict some portion as having different relations and ratios of dimensions.

FIRST EMBODIMENT

Figure 2:
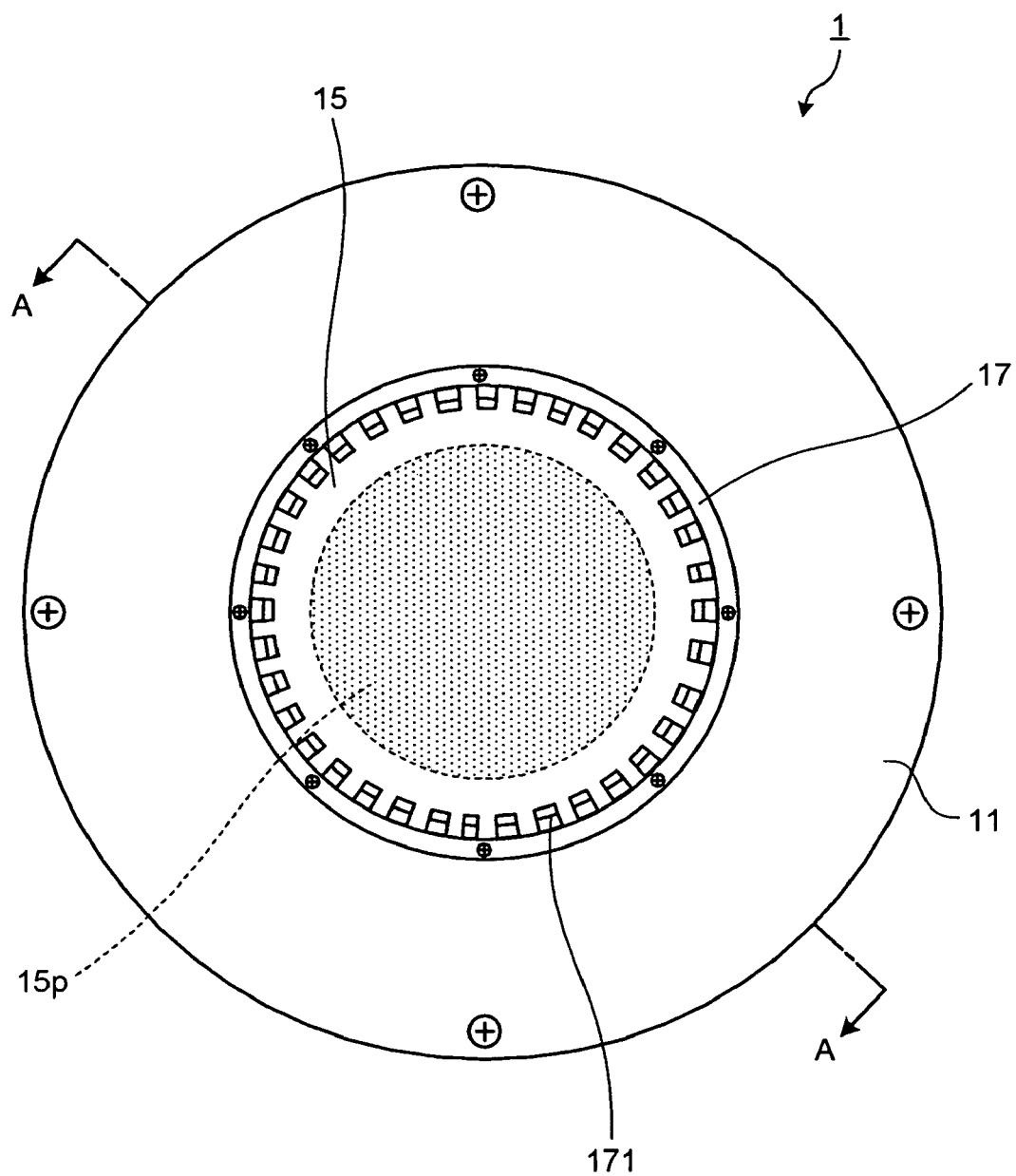
FIG. 2 is a top view of the structure of the probe card according to the first embodiment of the present invention.
Figure 3:
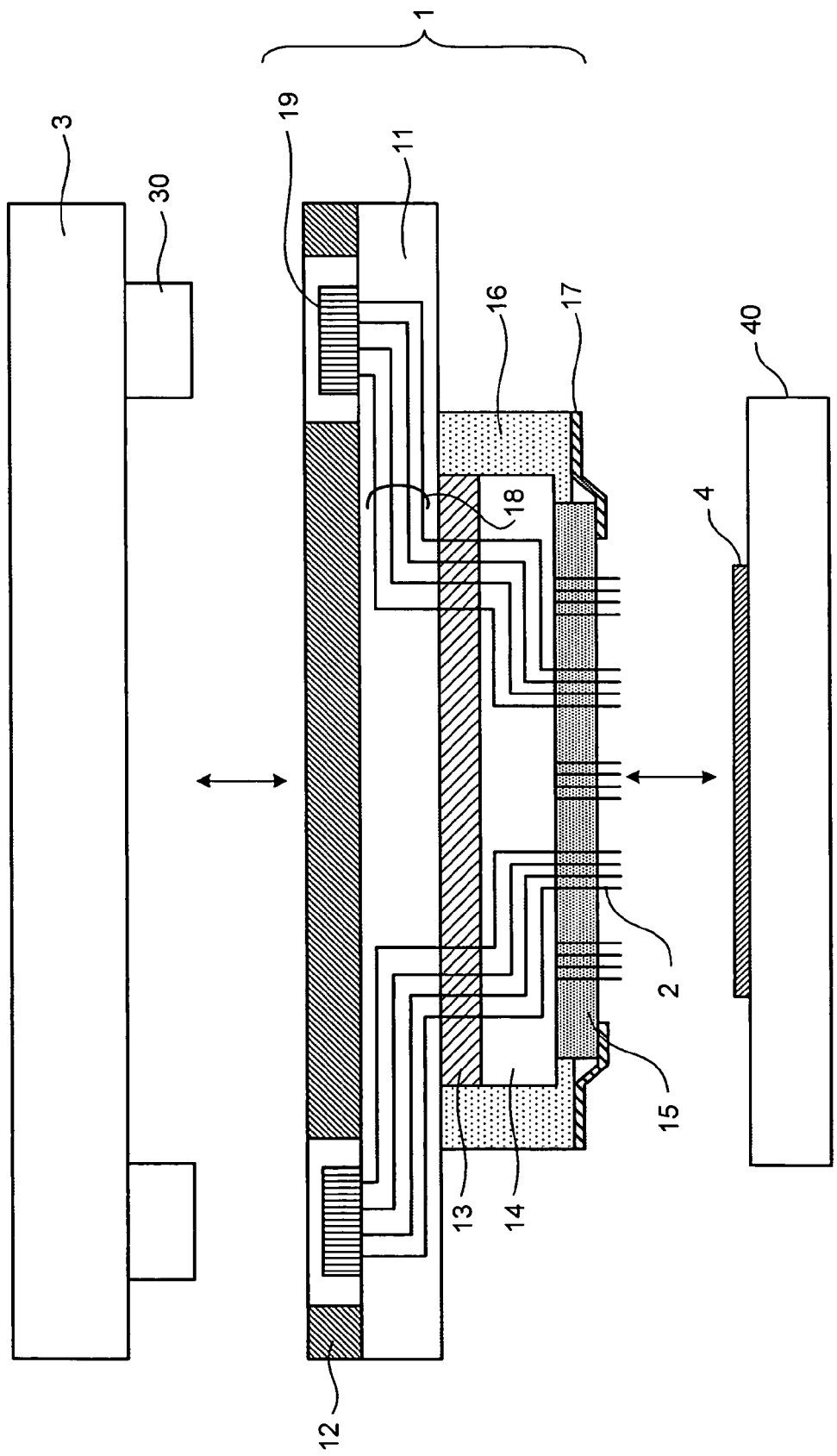
FIG. 3 is a diagram of an overview of a test performed by using the probe card according to the first embodiment of the present invention.

FIG. 1 is a exploded perspective view of the structure of relevant part of a probe card according to a first embodiment of the present invention. FIG. 2 is a top view of the probe card according to the first embodiment. FIG. 3 is a diagram of an overview of a test performed by using a probe card 1 and is a schematic sectional view taken along line A-A in FIG. 2 of the probe card 1. The probe card 1 shown in FIGS. 1 to 3 electrically connects, using a plurality of probes, a semiconductor wafer as a test object and a testing device including a circuit structure for generating a signal for a test.

The probe card 1 includes a substrate 11 that is formed in a thin disc shape and realizes electrical connection with the testing device, a reinforcing member 12 that is mounted on one side of the substrate 11 and reinforces the substrate 11, an interposer 13 for connection of wires from the substrate 11, a space transformer 14 that transforms intervals among the wires connected through the interposer 13, and a probe head 15 that is formed in a disc shape having a diameter smaller than that of the substrate 11 and stacked on the space transformer 14 and houses and holds a plurality of probes according to a wiring pattern of the test object. The probe card 1 also includes a holding member 16 that is fixed to the substrate 11 and collectively holds the interposer 13 and the space transformer 14 in a stacked state and a leaf spring 17 that is fixed to the holding member 16 and fixes an end of the probe head 15.

The more detailed structure of the probe card 1 is explained below. The substrate 11 is formed by using an insulative material such as Bakelite or epoxy resin. In the substrate 11, a wiring layer (wiring pattern) for electrically connecting the probes and the testing device is three-dimensionally formed by via-holes and the like.

The reinforcing member 12 includes a circular outer peripheral portion 121 that has substantially the same diameter as the substrate 11, a central portion 122 that has the center the same as that of a circle formed by the outer peripheral portion 121 and is formed in a disc shape having a surface area slightly larger than an area of the surface of the interposer 13, and a plurality of coupling portions 123 (four in FIG. 1) that extend from an outer peripheral direction of the central portion 122 to reach the outer peripheral portion 121 and couple the outer peripheral portion 121 and the central portion 122. Such a reinforcing member 12 is realized by a material of high hardness such as alumite-finished aluminum, stainless steel, an invar material, a Kovar material (registered trademark), or duralumin.

Figure 4:
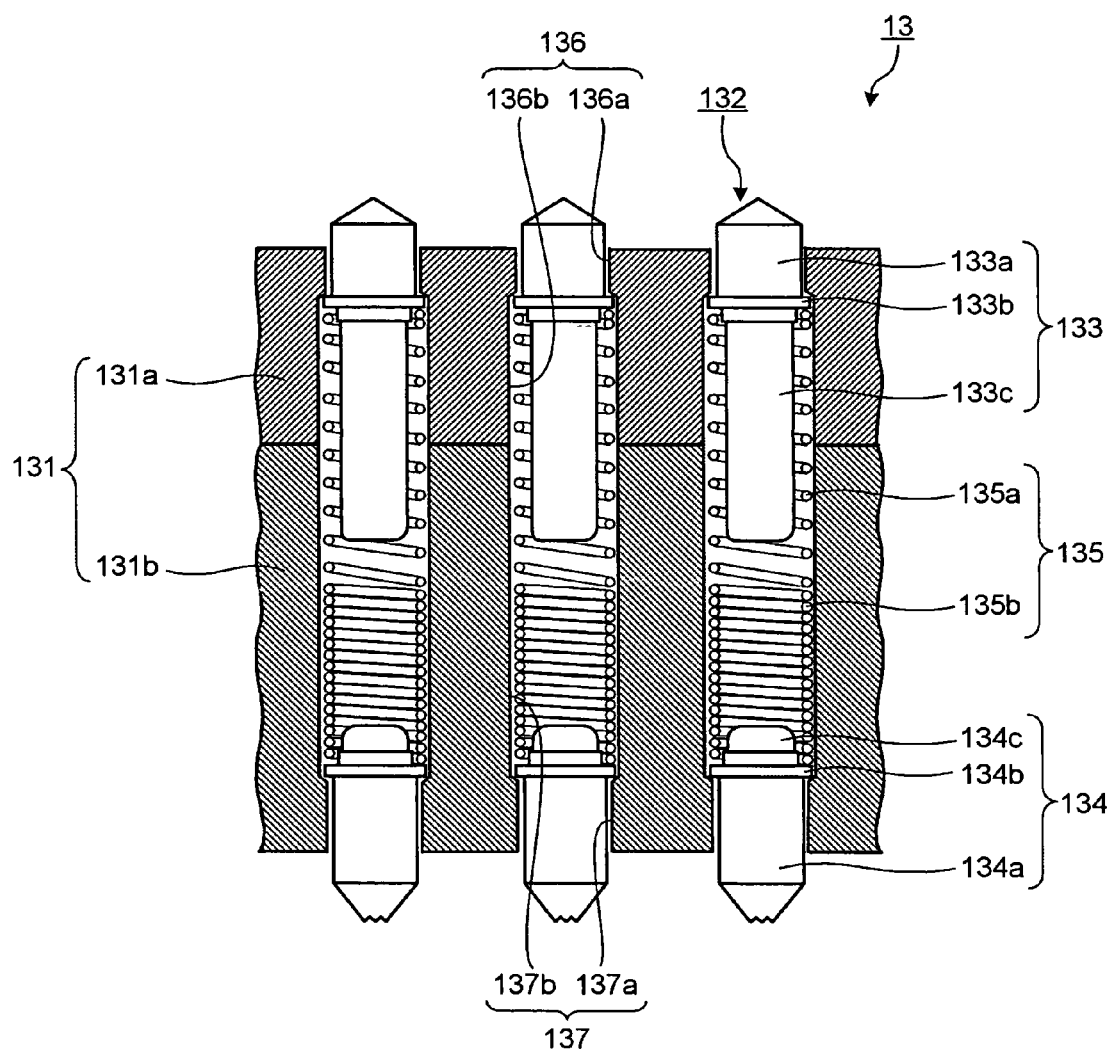
FIG. 4 is a partial sectional view of the internal structure of an interposer included in the probe card according to the first embodiment of the present invention.

The interposer 13 has a regular octagonal surface and is formed in a thin plate shape. FIG. 4 is an enlarged partial sectional view of the detailed internal structure of the interposer 13. As shown in FIG. 4, the interposer 13 is formed by housing and holding a plurality of connection terminals 132 in a housing 131. The connection terminals 132 include needle-like members 133 that come into contact with the substrate 11 when the interposer 13 is assembled, needle-like members 134 that come into contact with the space transformer 14 when the interposer 13 is assembled, and spring members 135 that are provided between the needle-like members 133 and the needle-like members 134 and resiliently couple the two kinds of needle-like members 133 and 134. The needle-like members 133 and 134 coupled to each other and the spring members 135 have identical axes. The needle-like members 133 and 134 have tapered tip shapes, respectively. One of the needle-like members 133 and 134 are first needle-lime members and the other of the needle-like members 133 and 134 are second needle-like members.

The needle-like members 133 include needle-like portions 133a that have sharp tips projecting in a tip direction, flange portions 133b that are provided in base end portions on the opposite side of the tips of the needle-like portions 133a and have a diameter larger than a diameter of the needle-like portions 133a, and boss portions 133c that project from surfaces on the opposite side of sides of the flange portions 133b in contact with the needle-like portions 133a and have a diameter smaller than the diameter of the flange portions 133b. The needle-like members 133 are formed in a shape axially symmetrical in a longitudinal direction thereof.

The needle-like members 134 include needle-like portions 134a having a tip from which a plurality of pawls project (in a crown shape), flange portions 134b that are provided on base end portions on the opposite side of tips of the needle-like portions 134a and have a diameter larger than a diameter of the needle-like portions 134a, and boss portions 134c that project from surfaces on the opposite side of sides of the flange portions 134b in contact with the needle-like portions 134a and have a diameter smaller than the diameter of the flange portions 134b. The needle-like members 134 are formed in a shape axially symmetrical in a longitudinal direction thereof. The diameter of the flange portions 134b is the same as that of the flange portions 133b. The diameter of the boss portions 134c is the same as that of the boss portions 133c.

Shapes of the needle-like portions 133a and 134a only have to be decided according to shapes and materials of members with which the needle-like portions 133a and 134a come into contact. Both the crown shape and the sharp tip shape are applicable as the shapes.

The needle-like member 133 sides of the spring members 135 are loosely wound portions 135a, while the needle-like member 134 sides thereof are tightly wound portions 135b. Ends of the loosely wound portions 135a are wound around the boss portions 133c. Ends of the tightly wound portions 135b are wound around the boss portions 134c. The loosely wound portions 135a and the flange portions 133b are joined and the tightly wound portions 135b and the flange portions 134b are joined by any one of a spring winding force and soldering or both. In the connection terminals 132 having the structure described above, with the spring members 135, the needle-like members 133 and 134 are resiliently movable in the up to down direction in FIG. 4.

The housing 131 that houses the connection terminals 132 having the structure described above is formed by superimposing a first member 131a and a second member 131b one on top of the other. Hole portions 136 that individually house the connection terminals 132 are formed in the first member 131a. The hole portions 136 include small diameter holes 136a having a diameter slightly larger than the diameter of the needle-like portions 133a and large diameter holes 136b having a diameter slightly larger than the diameter of the flange portions 133b. The small diameter holes 136a and the large diameter holes 136b are formed in stepped hole shapes having the same axes.

Hole portions 137 that individually house the connection terminals 132 are formed in the second member 131b. The hole portions 137 include small diameter holes 137a having a diameter slightly larger than the diameter of the needle-like portions 134a and large diameter holes 137b having a diameter slightly larger than the flange portions 134b. The small diameter holes 137a and the large diameter holes 137b are formed in stepped hole shapes having the same axes. As described above, the diameter of the flange portions 133b and the diameter of the flange portions 134b are equal. Therefore, the diameter of the large diameter holes 136b and the diameter of the large diameter holes 137b are also equal. When the first member 131a and the second member 131b are combined, the hole portions 136 and the hole portions 137 smoothly communicate with each other in an axial direction.

In an initial state shown in FIG. 4, the flange portions 133b of the needle-like members 133 come into contact with step portions forming boundaries between the large diameter holes 136b and the small diameter holes 136a in the hole portions 136 of the first member 131a to thereby perform a function of preventing the needle-like members 133 from coming off from the housing 131.

Similarly, the flange portions 134b of the needle-like members 134 come into contact with step portions forming boundaries between the small diameter holes 137a and the large diameter holes 137b in the hole portions 137 of the second member 131b to thereby perform a function of preventing the needle-like members 134 from coming off from the housing 131.

Figure 5:
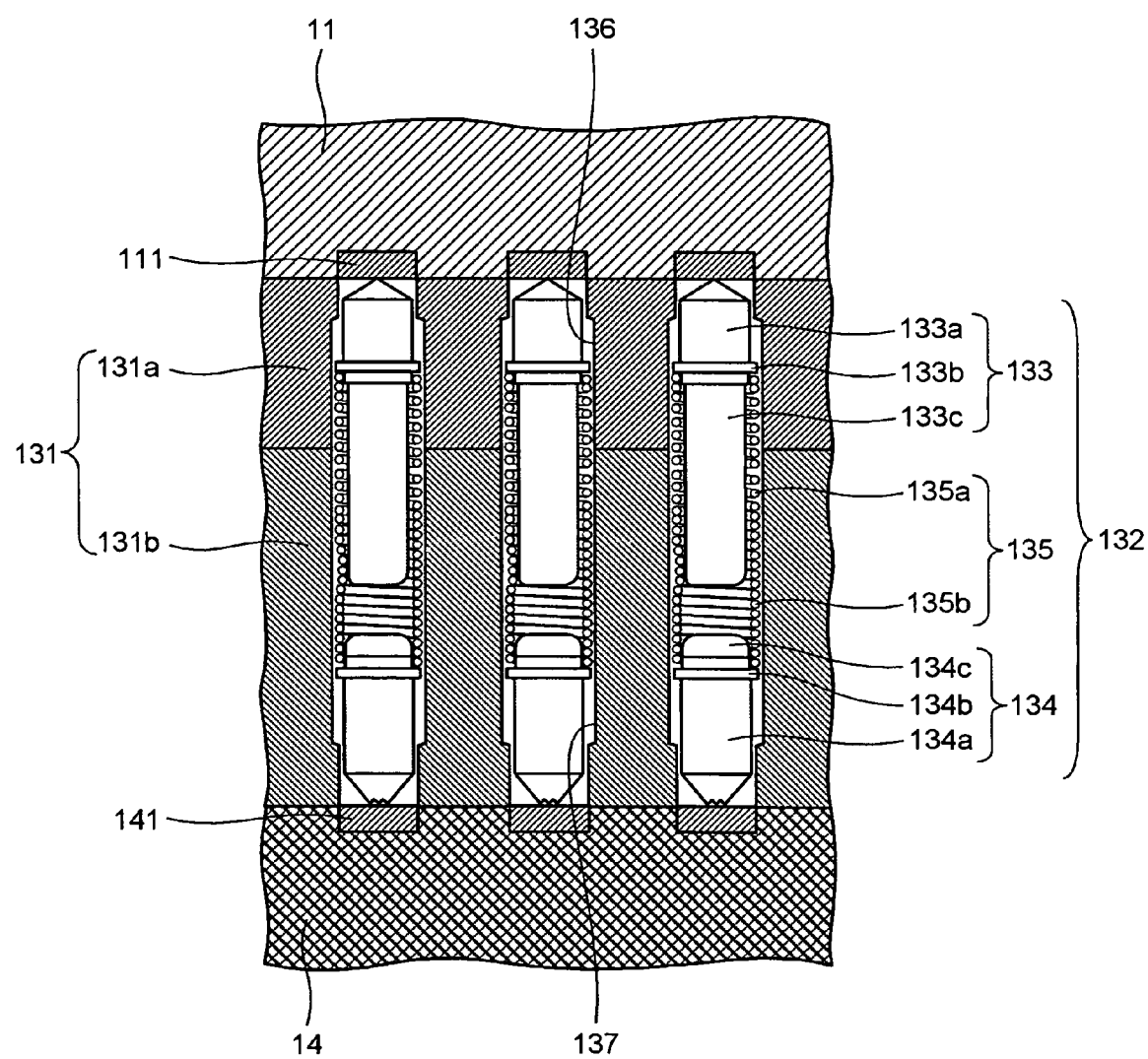
FIG. 5 is a diagram of the structure around the interposer in the probe card according to the first embodiment of the present invention.

FIG. 5 is a diagram of the structure around the interposer 13 of the probe card 1. As shown in FIG. 5, the interposer 13 is interposed between the substrate 11 and the space transformer 14. The tips of the needle-like members 133 come into contact with electrode pads 111 of the substrate 11 and, on the other hand, the tips of the needle-like members 134 come into contact with electrode pads 141 of the space transformer 14, whereby the interposer 13 for electrical connection between the substrate 11 and the space transformer 14.

In a state shown in FIG. 5, a part of the tightly wound portions 135b are in contact with the boss portions 133c of the needle-like members 133. Therefore, a linear electric signal along an axial direction of the connection terminals 132 flows to the tightly wound portions 135b, an electric signal does not flow in a coil shape to the loosely wound portions 135a, and an increase in the inductance of the connection terminals 132 can be controlled.

In the above explanation, the needle-like members 133 and 134 of the connection terminals 132 applied to the interposer 13 have the different shapes. However, needle-like members having the same shape can be connected by the spring members 135.

In the interposer 13 explained above, the connection terminals 132 including the coil springs and having the axes parallel to one another are applied. Therefore, the connection terminals 132 move independently from one another and it is possible to cause the interposer 13 to follow deformation of the substrate 11 and the space transformer 14. As a result, it is possible to prevent a part of the wires from being cut by the deformation of any one of the substrate 11 and the space transformer 14 or both and it is possible to absorb a difference between a coefficient of thermal expansion of a semiconductor wafer 4 and a coefficient of thermal expansion of the substrate 11.

When the interposer 13 and the conventional example in which the leaf springs are used as the connection terminals are compared in an identical space, a load and a stroke exerted to the connection terminals of the interposer 13 can be increased. As a result, it is possible to realize a further reduction in space in the interposer 13 than the interposer in which the leaf springs are used. Therefore, it is possible to sufficiently cope with an increase in pins and a reduction in pitches that follow an increase in the density of wires on a semiconductor wafer involved in a reduction in size of electronic apparatuses in recent years.

Moreover, in the interposer 13, the connection terminals 132 are only inserted in the housing 131 and are not fixed to the housing 131 by soldering or the like. Therefore, when there is a defect in one of the connection terminals 132, only the connection terminal 132 can be replaced and it is possible to perform maintenance easily and at low cost.

In the space transformer 14, as in the substrate 11, a wiring layer in the inside is three-dimensionally formed by via-holes and the like. The space transformer 14 has a regular octagonal surface substantially congruent with the interposer 13 and is formed in a thin plate shape. Such a space transformer 14 includes an insulating material such as ceramic as a base material and also plays a function of reducing a difference between the coefficient of thermal expansion of the semiconductor wafer and the coefficient of thermal expansion of the substrate 11.

The probe head 15 is formed in a disc shape and houses and holds the probes 2 in a probe housing area 15p shown in FIG. 2 such that the probes 2 project vertically on the paper surface in FIG. 2. An array pattern of the probes 2 is decided according to a wiring pattern of the semiconductor wafer 4 as a test object.

Figure 6:
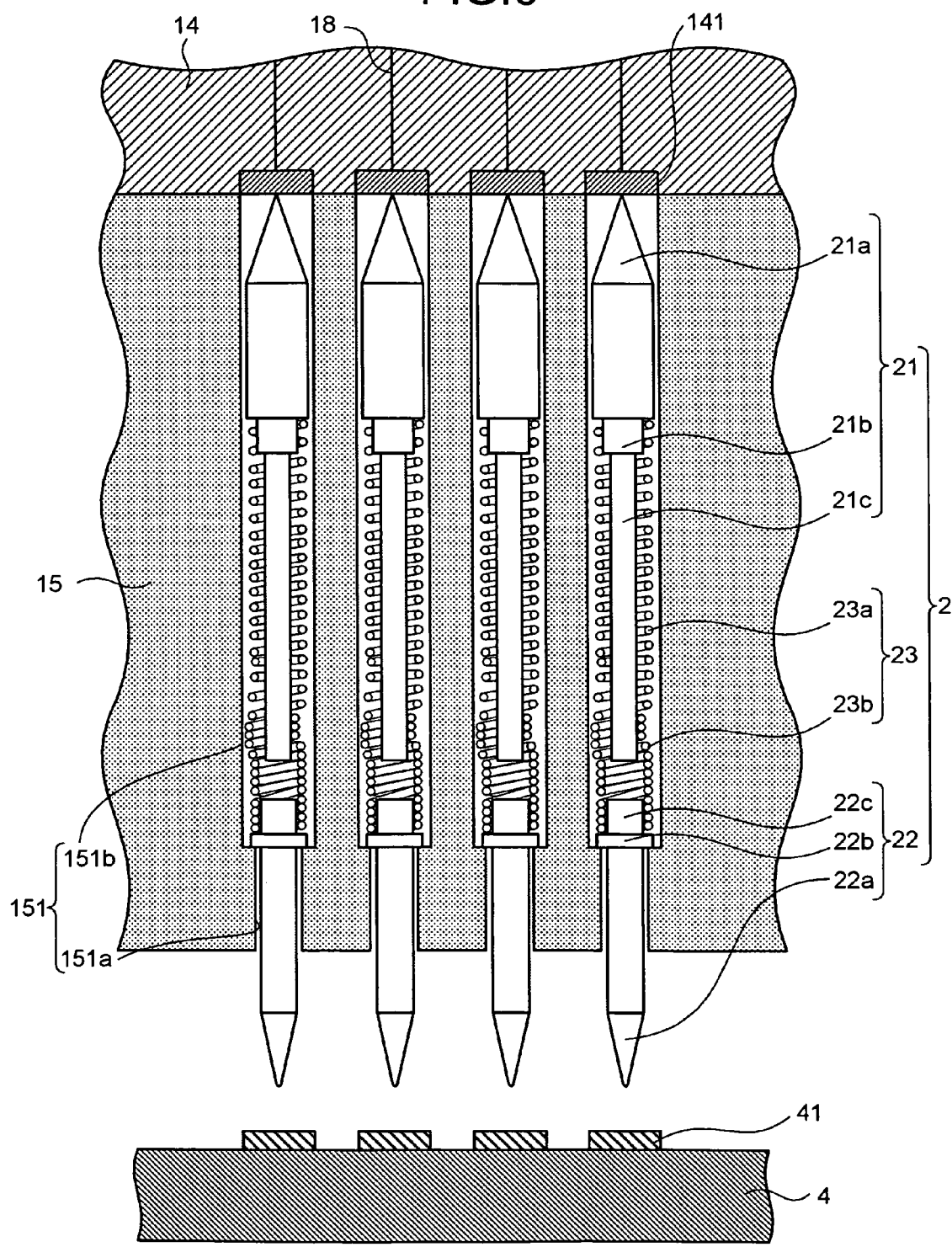
FIG. 6 is an enlarged partial sectional view of the structure of probes and relevant part of a probe head.

FIG. 6 is an enlarged partial sectional view of the structure of relevant part of the probe head 15 and the detailed structure of the probes 2. The probes 2 shown in FIG. 6 are disposed such that the tips on one side project according to an arrangement pattern of electrode pads 41 of the semiconductor wafer 4 placed on a wafer chuck 40. The tips (bottom surface sides) of the respective probes 2 come into contact with surfaces of a plurality of electrode pads 41 of the semiconductor wafer 4 from a vertical direction.

More specifically, the probes 2 include needle-like members 21 that are in contact with the space transformer 14, needle-like members 22 that project in a direction opposed to the needle-like members 21 and come into contact with the electrode pads 41 of the semiconductor wafer 4, and spring members 23 that are provided between the needle-like members 21 and the needle-like members 22 and resiliently couple the two kinds of needle-like members 21 and 22. The needle-like members 21 and 22 coupled to each other and the spring members 23 have identical axes.

The needle-like members 21 include needle-like portions 21a that have sharp tips projecting in a tip direction, boss portions 21b that are provided in base end portions on the opposite side of the sharp tips of the needle-like portions 21a and have a diameter smaller than a diameter of the needle-like portions 21a, and shaft portions 21c that extend out from surfaces on the opposite side of sides of the boss portions 21b in contact with the needle-like portions 21a. The needle-like members 21 are formed in a shape axially symmetrical in a longitudinal direction thereof. On the other hand, the needle-like members 22 include needle-like portions 22a that have sharp tips projecting in a tip direction, flange portions 22b that are provided in base end portions on the opposite side of the sharp tips of the needle-like portions 22a and have a diameter larger than a diameter of the needle-like portions 22a, and boss portions 22c that project from surfaces on the opposite side of sides of the flange portions 22b in contact with the needle-like portions 22a and have a diameter smaller than the diameter of the flange portions 22b. The needle-like members 21 are formed in a shape axially symmetrical in a longitudinal direction thereof.

The needle-like member 21 sides of the spring members 23 are loosely wound portions 23a and, on the other hand, the needle-like member 22 sides thereof are tightly wound portions 23b. Ends of the loosely wound portions 23a are wound around the boss portions 21b of the needle-like members 21. Ends of the tightly wound portions 23b are wound around the boss portions 22c of the needle-like members 22. The loosely wound portions 23a and the boss portions 21b are joined and the tightly wound portions 23b and the boss portions 22c are joined by any one of a spring winding force and soldering or both.

In the probes 2 having the structure described above, because the spring members 23 are provided, the needle-like members 21 and 22 are resiliently movable in the up to down direction in FIG. 6. At least a part of the tightly wound portions 23b are in contact with the shaft portions 21c of the needle-like members 21 in a state in which the needle-like members 21 are in contact with the electrode pads 141, i.e., a state shown in FIG. 6. In other words, the length in an axial direction of the tightly wound portions 23b is set to length with which the state shown in FIG. 6 can be realized. An inner diameter of the spring members 23 is slightly larger than an outer diameter of the boss portions 21b and the boss portions 22c. Consequently, it is possible to achieve improved resiliency of the spring members 23.

Although not shown in FIGS. 3 and 6, the probes 2 housed and held in the probe head 15 include a probe for a ground and a probe or electric power supply. Therefore, some of wires 18 connected to the probes 2 are connected to a ground layer and a power supply layer.

The probe head 15 is formed by using an insulative material such as ceramics. Hole portions 151 for housing the probes 2 are pierced through the probe head 15 in a thickness direction (vertical direction in FIG. 6) according to an array of the semiconductor wafer 4. The hole portions 151 include small diameter holes 151a formed from a lower part in FIGS. 3 and 6, i.e., a facet on the semiconductor wafer 4 side over at least predetermined length smaller than the length in a longitudinal direction of the needle-like portions 22a and large diameter holes 151b that have center axes the same as those of the small diameter holes 151a and have a diameter larger than that of the small diameter holes 151a. As shown in FIG. 6, an inner diameter of the small diameter holes 151a is slightly larger than an outer diameter of the needle-like portions 22a of the needle-like members 22 and slightly smaller than an outer diameter of the flange portions 22b. The hole portions 151 are formed in a stepped hole shape in this way, whereby (the needle-like members 22 of) the probes 2 are prevented from coming off.

The number and an arrangement pattern of the probes 2 housed in the probe head 15 are decided according to the number of semiconductor chips formed in the semiconductor wafer 4 and an arrangement pattern of the electrode pads 41. For example, when the semiconductor wafer 4 having a diameter of 8 inches (about 200 millimeters) is a test object, several hundreds to several thousands probes 2 are necessary. When the semiconductor wafer 4 having a diameter of 12 inches (about 300 millimeters) is a test object, several thousands to several ten thousands probes 2 are necessary. When the large number of probes 2 are held in this way, deformation such as warp, waviness, and irregularity of the probe head 15 is a problem. However, in the first embodiment, pawl portions 171 of the leaf spring 17 uniformly press the entire circumference near an edge of the probe head 15 having a circular surface. Therefore, irregular warp and waviness do not occur in the probe head 15, the probe head 15 is excellent in durability, and a stable probe stroke can be obtained.

The probe head 15 can be divided into two, i.e., upper and lower portions, along the vertical direction in FIG. 6. In this case, the two portions are coupled by using screws and positioning pins. To prevent a plate on a lower side from being expanded by an initial load of the probes 2, the thickness of the portion on the lower side is set larger than the thickness of the portion on the upper side. By dividing the probe head 15 in this way, it is possible to easily replace the probes 2.

Subsequently, the structure of the probe card 1 is explained. The holding member 16 is made of the same material as the reinforcing member 12 and has a hollow portion of a regular octagonal pole shape in which the interposer 13 and the space transformer 14 can be stacked and held. The holding member 16 presses and holds the interposer 13 and the space transformer 14 against the substrate 11 to thereby apply a pressure necessary for the substrate 11 and the space transformer 14 to be electrically connected via the interposer 13.

The leaf spring 17 is formed of a resilient material such as phosphor bronze, stainless steel (SUS), or beryllium copper and is formed in a thin annular shape. In an inner circumference of the leaf spring 17, the pawl portions 171 as pressing members for holding the interposer 13, the space transformer 14, and the probe head 15 are uniformly provided over the entire circumference. Such pawl portions 171 equally press the entire circumference near an edge of the surface of the probe head 15 in a direction of the substrate 11. Therefore, a substantially uniform initial load is generated in the probes 2 housed in the probe head 15 and warp of the probe head 15 can be prevented. In the first embodiment, the respective surfaces of the interposer 13 and the space transformer 14 are formed in a regular octagonal shape having an area substantially the same as a circle formed by the surface of the probe head 15. Therefore, the pawl portions 171 can press a vertex position of the regular octagonal shape and also plays a function of preventing warp of the interposer 13 and the space transformer 14.

The substrate 11 and the reinforcing member 12, the substrate 11 and the holding member 16, and the holding member 16 and the leaf spring 17 are respectively fastened by screws inserted in predetermined positions (now shown in FIG. 1).

One ends of the wires 18 formed in the substrate 11 are connected to a plurality of male connectors 19 disposed on a surface of the substrate 11, which is a surface on a side where the reinforcing member 12 is mounted, to be connected to a testing device (not shown). On the other hand, the other ends of the wires 18 are connected to the probes 2, which are housed and held in the probe head 15, via the electrode pads 141 formed at a lower end of the space transformer 14. In FIG. 3, for simplification of illustration, only a part of the wires 18 are shown.

The respective male connectors 19 are disposed radially with respect to the center of the substrate 11 and form pairs with respective female connectors 30 provided in positions opposed thereto in the connector seat of the testing device. Terminals of the probes 2 and the testing device come into contact with each other to thereby establish electrical connection between the probes 2 and the testing device. As a connector including the male connectors 19 and the female connectors 30, it is possible to apply a zero insertion force (ZIF) type connector that requires little external force when male connectors are inserted and pulled and applies a press contact force to the connectors using an external force after the connectors are coupled. If the ZIF type connector is applied, the probe card 1 and the testing device are hardly subjected to stress due to connection even if the number of the probes 2 is large, sure electrical connection can be obtained, and durability of the probe card 1 can be improved.

Female connectors can be disposed in the substrate 11 and, on the other hand, male connectors can be disposed in the connector seat 3. It goes without saying that a shape of the male connectors and arrangement positions on the substrate of the male connectors are not limited to those described above and a shape and arrangement positions of the female connectors provided on the testing device side are also changed according to the shape and the arrangement positions of the male connectors.

Instead of realizing the connection between the probe card and the testing device using the connectors, it is also possible that terminals such as pogo pins having a spring action are provided in the testing device and the probe card is connected to the testing device via such terminals.

In the probe card 1 having the structure described above, when the electrode pads 41 of the semiconductor wafer 4 are brought into contact with tip portions of the needle-like portions 22a by lifting the wafer chuck 40 from the state shown in FIGS. 3 and 6, the needle-like members 22 rise and the spring members 23 are compressed and curve to meander. In this case, because a part of the tightly wound portions 23b maintains a state of contact with the shaft portions 21c of the needle-like members 21, a linear electric signal along the axial direction of the probe 2 flows to the tightly wound portion 23b. Therefore, an electric signal does not flow in a coil shape to the loosely wound portion 23a and an increase in the inductance of the probes 2 can be controlled.

With the probe card according to the first embodiment of the present invention explained above, a probe card that electrically connects a semiconductor wafer as a test object and a circuit structure for generating a signal for a test is provided. The probe card includes a plurality of probes that are made of a conductive material and come into contact with the semiconductor wafer to input or output an electric signal, a probe head that houses and holds the probes, a substrate that has a wiring pattern corresponding to the circuit structure, a reinforcing member that is mounted on the substrate and reinforces the substrate, an interposer that includes a housing having formed therein a plurality of connection terminals made of a conductive material and resilient in an axial direction thereof and a plurality of hole portions made of an insulative material each housing one of the connection terminals, is stacked on the substrate for connection of wires of the substrate, and a space transformer that is interposed and stacked between the interposer and the probe head, transforms intervals among the wires to be connected through the interposer, and leads out the wires to a surface on a side opposed to the probe head. Consequently, it is possible to surely perform electrical connection between the substrate and the space transformer and perform maintenance easily and at low cost.

With the probe card according to the first embodiment, a plurality of connector terminals including coil springs and having axes parallel to one another are applied to the interposer. Therefore, the respective connection terminals move independently from one another and it is possible to cause the interposer to follow deformation of the substrate and the space transformer. As a result, it is possible to prevent a part of the wires from being cut by the deformation of the substrate and the space transformer.

With the probe card according to the first embodiment, the connection terminals of the interposer include the coil springs resilient in a thickness direction. Therefore, when the interposer and the conventional example in which the leaf springs are used as the connection terminals are compared in an identical space, a load and a stroke exerted to the connection terminals can be increased in the interposer. As a result, it is possible to realize a further reduction in space than the interposer in which the leaf springs are used.

Further, with the probe card according to the first embodiment, the leaf spring uniformly presses the entire circumference near an edge of the probe head surface in a direction of the substrate. Therefore, it is possible to control warp of the interposer, the space transformer, and the probe head besides the substrate and improve accuracy of the flatness and the parallelism of the entire probe card.

SECOND EMBODIMENT

A probe card according to a second embodiment of the present invention is of basically the same configuration as that of the first embodiment except for the structure of an interposer. The probe card of the second embodiment includes the substrate 11, the reinforcing member 12, the space transformer 14, the probe head 15, the holding member 16, and the leaf spring 17. The probe head 15 houses and holds the probes 2 described previously in the first embodiment.

Figure 7:
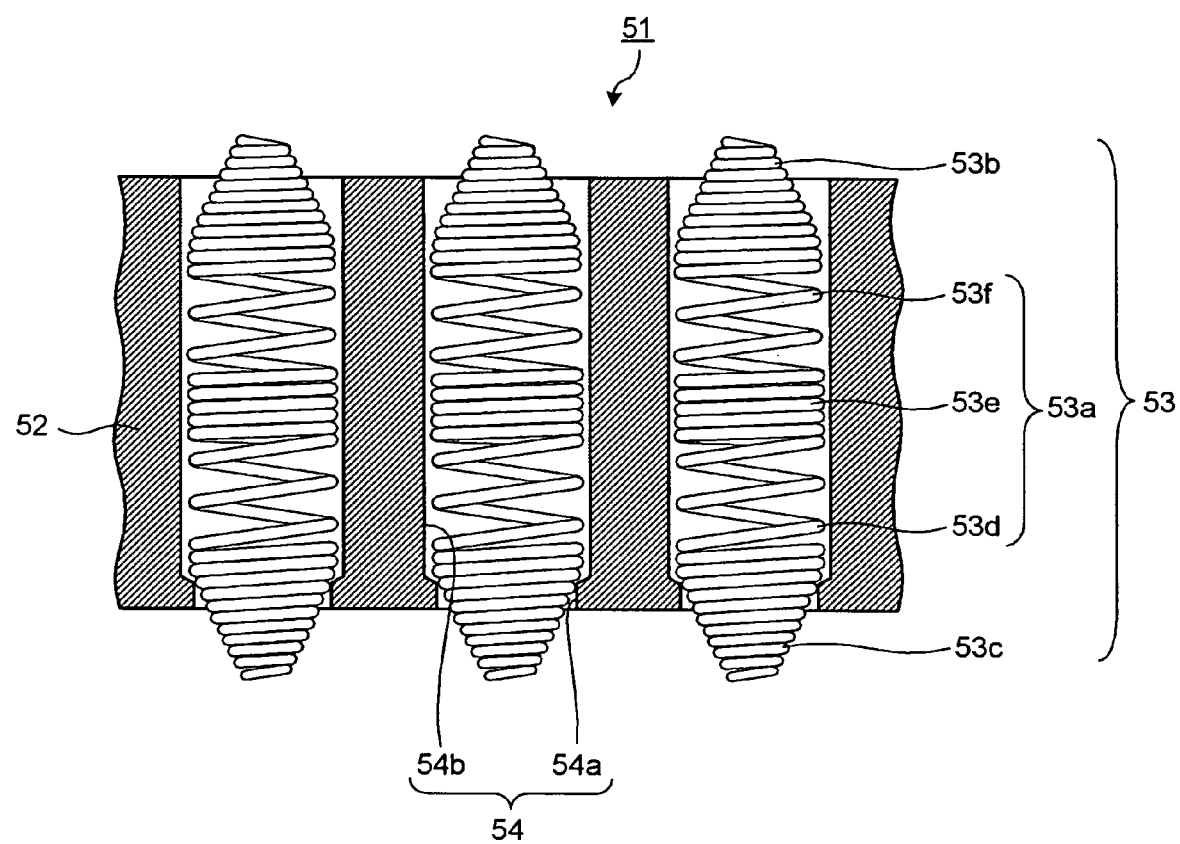
FIG. 7 is a partial sectional view of the internal structure of an interposer included in a probe card according to a second embodiment of the present invention.

The structure of the interposer applied to the probe card of the second embodiment is explained in detail below. FIG. 7 is a partial longitudinal sectional view of the structure of the interposer applied to the probe card according to the second embodiment. An interposer 51 shown in FIG. 7 includes a housing 52 as a base material and a plurality of connection terminals 53 housed and held in the housing 52.

The connection terminals are formed by winding a conductive material and include coil spring portions 53a wound to have a cylindrical shape and a pair of electrode pin portions 53b and 53c closely wound in a tapered shape from both ends of the coil spring portions 53a. The coil spring portions 53a include constantly wound portions 53d, tightly wound portions 53e, and loosely wound portions 53f formed at pitches relatively rougher than the constantly wound portions 53d. With the connection terminals 53 having such structure, it is possible to prevent a tangle from occurring in the coil spring portions 53a when the connection terminals 53 are compressed and deformed.

The housing is made of a single member. Hole portions 54 that individually house the connection terminals 53 are formed in the housing 52. The hole portions 54 include small diameter holes 54a that hold the coil spring portions 53c and prevent the electrode pin portions 53c from coming off and large diameter holes 54b that have a diameter slightly larger than a diameter of intermediate portions of the connection terminals 53. The small diameter holes 54a and the large diameter holes 54b are formed in a stepped hole shape having the same axes. When the connection terminals 53 are inserted in the housing 52 having such structure, the connection terminals 53 are inserted from end opening surfaces of the large diameter holes 54b.

Figure 8:
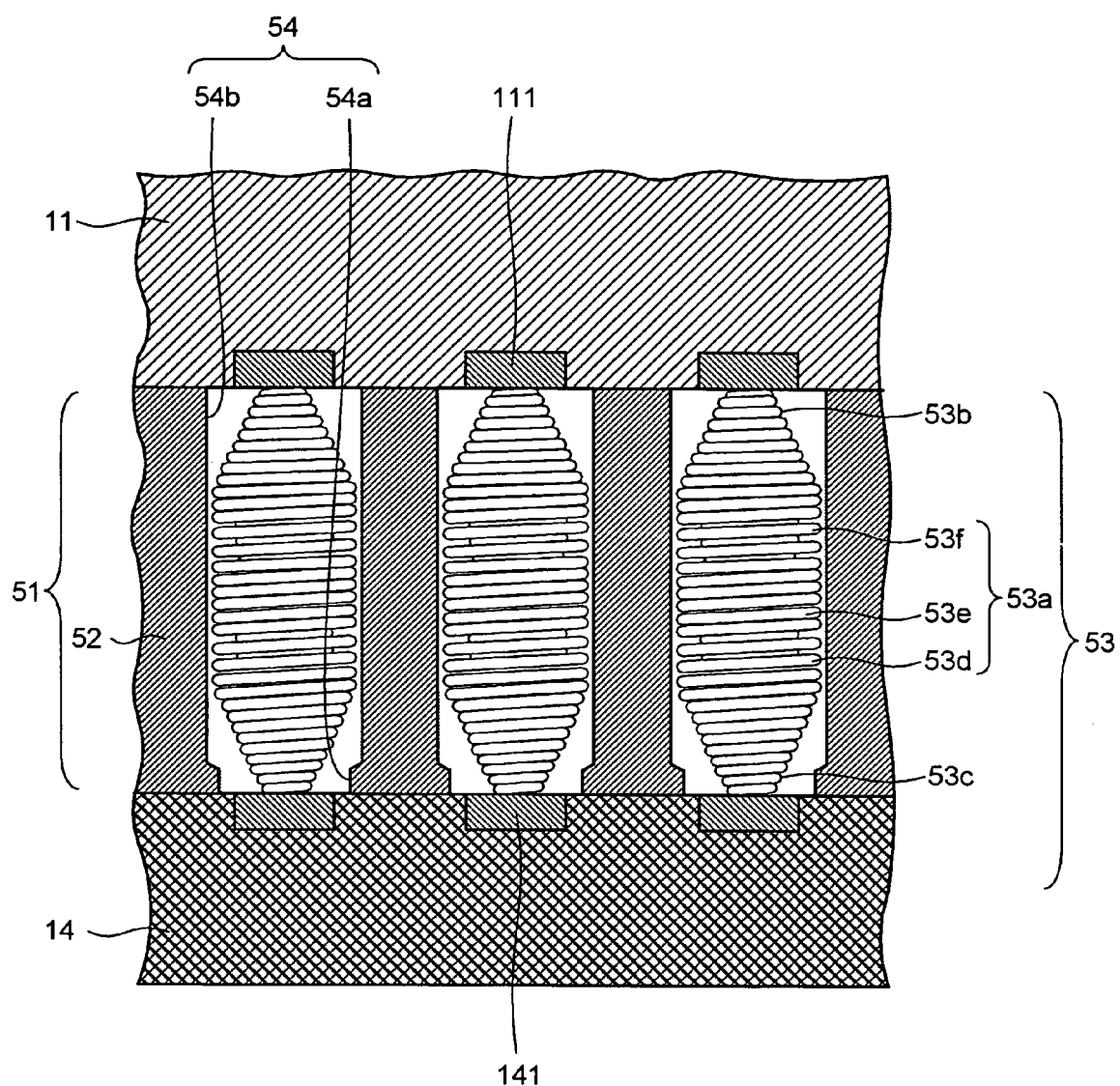
FIG. 8 is a diagram of the structure around the interposer in the probe card according to the second embodiment of the present invention.

FIG. 8 is a diagram of the structure around the interposer 51 in the probe card. In a state shown in FIG. 8, the constantly wound portions 53d and the loosely wound portions 53f of the coil spring portions 53a bend and come into a substantially closely attached state and tips of the electrode pin portions 53c of the connection terminals 53 come into contact with the electrode pads 141 of the space transformer 14. On the other hand, tips of the electrode pin portions 53b of the connection terminals 53 come into contact with the electrode pads 111 of the substrate 11 to thereby establish electrical connection between the substrate 11 and the space transformer 14.

Because the electrode pin portions 53b and 53c are closely wound, electricity is transmitted in a substantially axial direction via portions that are in contact with an axial direction of windings. Therefore, an electric signal does not flow in a coil shape in the electrode pin portions 53b and 53c. Consequently, the numbers of windings of the electrode pin portions 53b and 53c do not affect electric performance including the impedance of the connection terminals 53.

The electrode pin portions 53b and 53c are formed in a tapered shape and resiliently in contact with the electrode pads 111 and 141, respectively. Therefore, it is possible to reduce fluctuation in positions of projecting ends of the electrode pin portions 53b and 53c and bring the projecting ends into uniform contact with contacted members.

With the probe card according to the second embodiment of the present invention explained above, the same effect as is achieved in the first embodiment can also be achieved.

According to the second embodiment, the connection terminals of the interposer include the coil spring member alone. Therefore, only a small number of components are necessary compared with the connection terminals applied to the interposer according to the first embodiment. It is possible to further reduce cost required for manufacturing and maintenance.

OTHER EMBODIMENTS

Figure 9:
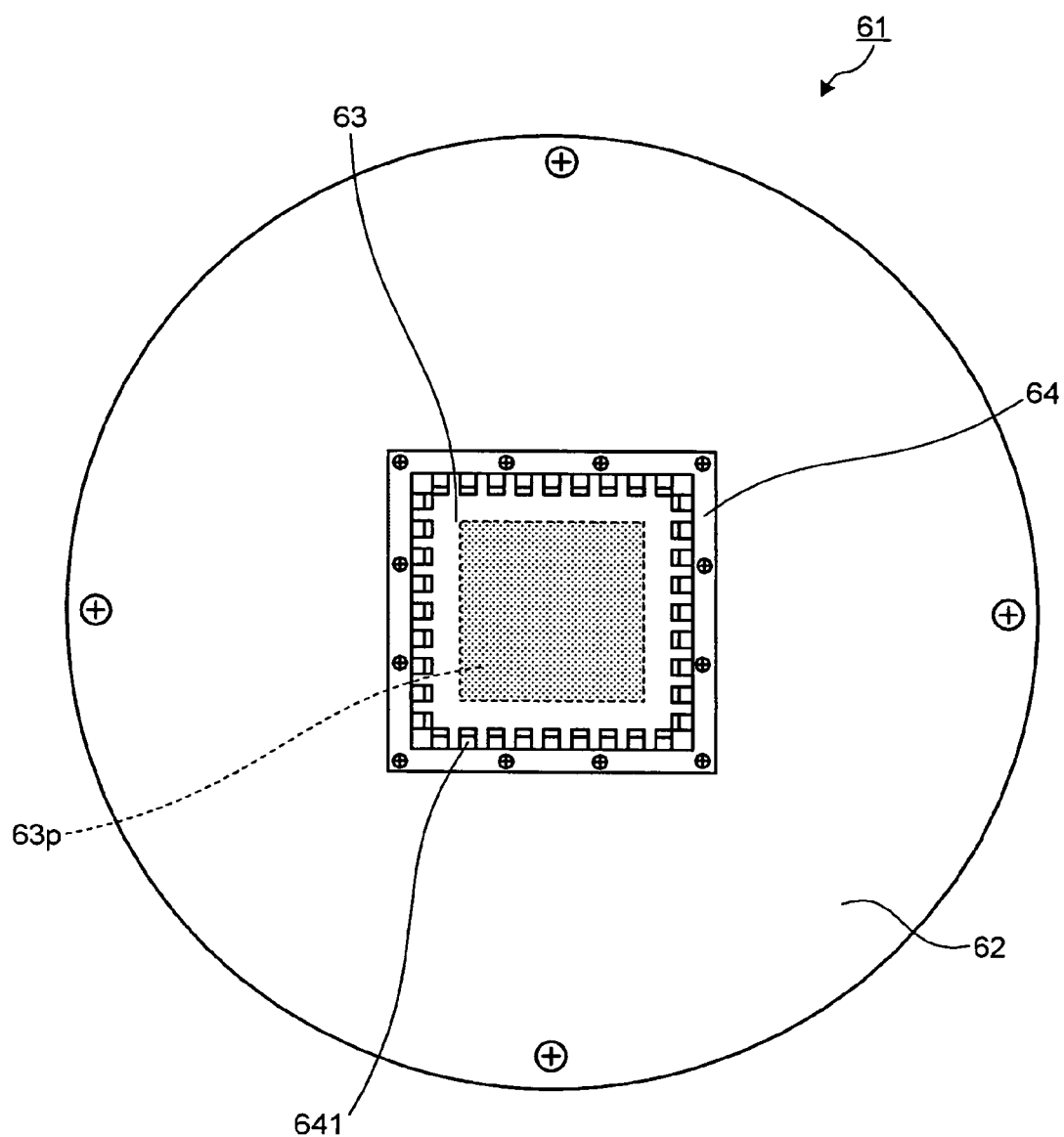
FIG. 9 is a top view of the structure of a probe card according to another embodiment of the present invention.
Figure 10:
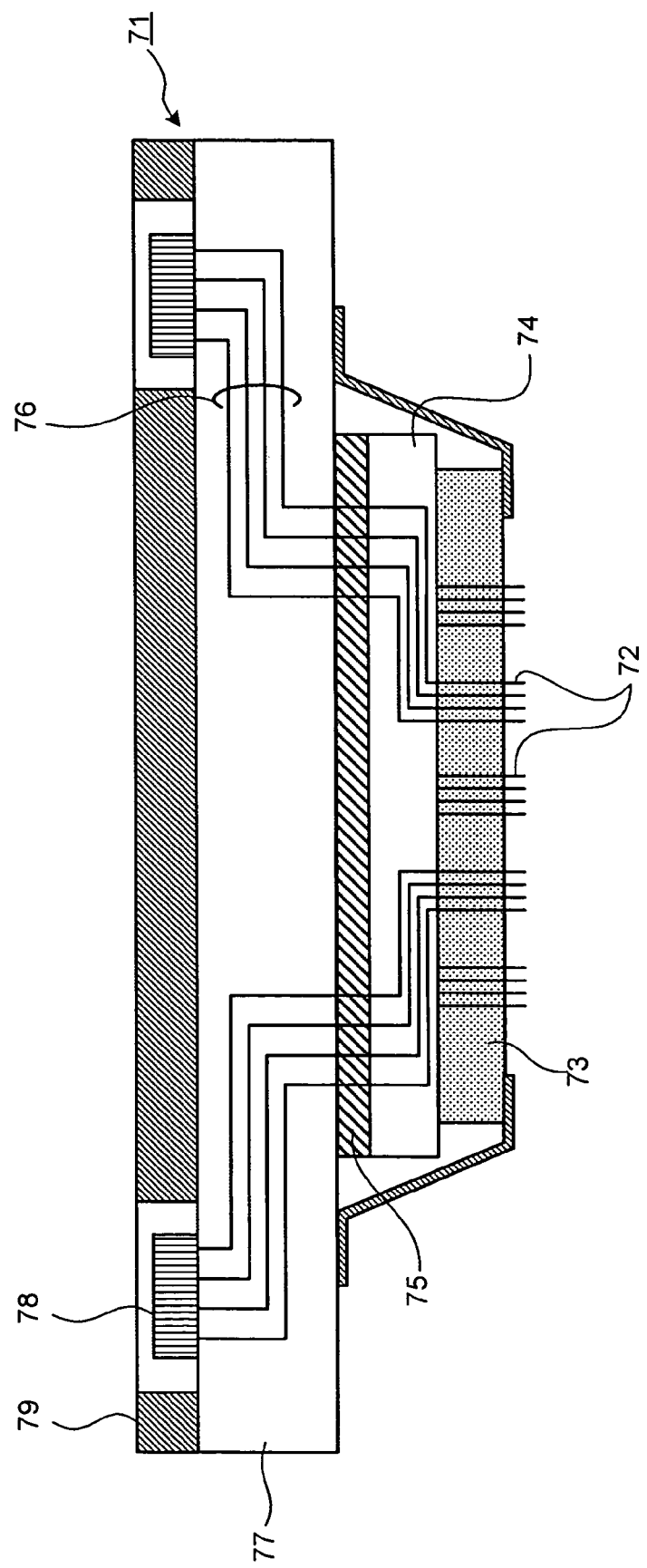
FIG. 10 is a diagram of the structure of a probe card.

The first and second embodiments are described above as the best modes for carrying out the present invention; however, the present invention is not to be restricted to them. FIG. 9 is a top view of the structure of a probe card according to another embodiment of the present invention. In a probe card 61 shown in FIG. 9, a probe head 63 having a square surface is held on a substrate 62 of a disc shape by a leaf spring 64 having an outer frame of the same square shape.

In the probe card 61, surfaces of an interposer and a space transformer are also formed in a square shape. Pawl portions 641 formed in an inner circumference of the leaf spring 64 are uniformly formed over the entire inner circumference of the probe head 63 and uniformly press the entire circumference near an edge of the surface of the probe head 63 in a direction of the substrate 62. Therefore, it is possible to control, in addition to warp and waviness of the probe head 63, warp and waviness of the interposer and the space transformer. As in the two embodiments, it is possible to improve accuracy of the flatness and the parallelism of the probe card.

In FIG. 9, a probe housing area 63p in which the probe head 63 houses the probes is formed in a square shape. This is applied, for example, when the probes collectively come into contact with about a half to a quarter of an area of a semiconductor wafer.

In the probe card according to the present invention, the leaf spring only has to uniformly press the entire circumference near an edge of a surface of the probe head, which is a surface on a side where the probes project, in a direction of the substrate. A shape of the probe head is not limited to that described above. For example, the shape of the probe head can be a regular octagonal shape similar to that of the interposer and the space transformer in the two embodiments. In this case, if the leaf spring is formed in a regular octagonal shape similar to that of the probe head and pawl portions are formed in the leaf spring to make it possible to uniformly press the entire circumference including at least respective vertexes of the regular octagonal shape, the same effect can be obtained.

Respective surface shapes of the interposer and the space transformer can be a circular shape similar to the probe head. In this case, the probe card for the FWLT has highest symmetry. Therefore, this is optimum when flatness and parallelism of the probe card is given a top priority.

Besides, the respective surfaces of the interposer and the space transformer can be formed in an appropriate regular polygonal shape and the probe head can be formed in a regular polygonal shape similar to the regular polygonal shape. When the probe head comes into full contact with the semiconductor wafer, the probe head can be circular. In this way, the probe card according to the present invention can include the substrate and the probe head formed in shapes other than a disc shape. The shapes can be changed according to a shape of a test object and an arrangement pattern of electrode pads provided in the test object.

In the above explanation, the probes 2 come into contact with a semiconductor wafer as a test object. However, as the probes applied to the probe card according to the present invention, any of various types of known probes can be applied.

It is obvious from the above description that the invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As described above, the probe card according to the present invention is useful for an electric characteristic test for a semiconductor wafer and is particularly suitable for the FWLT.

The invention claimed is:

1. A probe card that electrically connects a semiconductor wafer as a test object and a circuit structure for generating a signal for a test, the probe card comprising:
   a plurality of probes that are made of a conductive material and come into contact with the semiconductor wafer to receive or output an electric signal;
   a probe head that houses and holds the probes;
   a substrate that has a wiring pattern corresponding to the circuit structure;
   a reinforcing member that is mounted on the substrate and reinforces the substrate;
   an interposer that includes a housing and is stacked on the substrate for connection of wires of the substrate, the housing having a plurality of connection terminals made of a conductive material and resilient in an axial direction of the connection terminals and a plurality of hole portions made of an insulative material each housing one of the connection terminals; and
   a space transformer that is interposed and stacked between the interposer and the probe head and transforms intervals among the wires to be connected through the interposer, the wires coming out on a surface of the space transformer facing the probe head.

2. The probe card according to claim 1, wherein the connection terminals each include
   a first needle-like member and a second needle-like member each having a tapered tip; and
   a spring member that is in a coil shape and resiliently connects the first needle-like member to the second needle-like member such that axial directions of the first needle-like member and the second needle-like member match.

3. The probe card according to claim 2, wherein the spring member includes a tightly wound portion that is bendable in each of the hole portions and, when bent, comes into contact with any one of the first needle-like member and the second needle-like member.

4. The probe card according to claim 1, wherein
   the connection terminals are in a coil shape, and each include
   a pair of electrode pin portions in each of which a coil is closely wound to be tapered toward either end in the axial direction; and
   a coil spring portion that connects between the electrode pin portions.

5. The probe card according to claim 4, wherein the coil spring portion includes:
   a tightly wound portion that is arranged in a middle, in the axial direction, of each of the connection terminals;
   a constantly wound portion that is arranged on a side of the tightly wound portion; and
   a loosely wound portion that is arranged on a side of the tightly wound portion other than where the constantly wound portion is arranged, in which a coil is wound more loosely than in the constantly wound portion.

6. The probe card according to claim 1, further comprising:
   a holding member that is fixed to the substrate and presses and holds the interposer and the space transformer; and
   a leaf spring that is fixed to the holding member and presses an edge portion of a surface of the probe head over entire circumference in a direction of the substrate, the probes projecting from the surface of the probe head.

* * * * *